United States Patent
Daubenspeck et al.

(10) Patent No.: US 8,546,253 B1
(45) Date of Patent: Oct. 1, 2013

(54) SELF-ALIGNED POLYMER PASSIVATION/ALUMINUM PAD

(75) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/415,902

(22) Filed: Mar. 9, 2012

(51) Int. Cl.
*H01L 23/498* (2006.01)
*H01L 21/768* (2006.01)

(52) U.S. Cl.
USPC ........... 438/612; 257/734; 257/736; 257/738; 257/E23.015; 257/E23.02; 438/666; 438/669

(58) Field of Classification Search
USPC ............ 257/734, 736, 738, E23.015, E23.02; 438/612, 666, 669
See application file for complete search history.

(56) References Cited

U.S. PATENT DOCUMENTS

| | | | |
|---|---|---|---|
| 3,711,625 A | 1/1973 | Dupuis | |
| 4,613,888 A * | 9/1986 | Mase et al. | 257/637 |
| 5,112,448 A | 5/1992 | Chakravorty | |
| 6,365,968 B1 | 4/2002 | Qian et al. | |
| 6,472,280 B2 | 10/2002 | Jeng et al. | |
| 6,534,845 B1 | 3/2003 | Yamada et al. | |
| 6,574,260 B2 | 6/2003 | Salvatore et al. | |
| 6,913,951 B2 | 7/2005 | Yamada et al. | |
| 6,958,546 B2 | 10/2005 | Fan et al. | |
| 7,442,650 B2 | 10/2008 | Biolsi et al. | |
| 7,549,870 B2 | 6/2009 | Mason et al. | |
| 2002/0131466 A1 | 9/2002 | Salvatore et al. | |
| 2003/0102545 A1 | 6/2003 | Yamada et al. | |
| 2005/0048772 A1 | 3/2005 | Pan | |
| 2006/0205200 A1 | 9/2006 | Richiuso | |
| 2008/0160794 A1 | 7/2008 | Mason et al. | |
| 2008/0166879 A1 | 7/2008 | Biolsi et al. | |
| 2009/0017632 A1 | 1/2009 | Biolsi et al. | |

FOREIGN PATENT DOCUMENTS

JP 62-040770 2/1987

OTHER PUBLICATIONS

Hiro et al., "Thicker Film Photodefinable Polyimides: Self-Imaging Polymer Systems Offer Ease of Use and Improved Resolution", Advanced Packaging, Oct. 2000, 4 pages.
Flack et al., "Characterization Study of an Aqueous Developable Photosensitive Polyimide on 300 mm Wafers", SPIE 2001, # 4346-96, pp. 1-11.
Caterer et al., "Processing Thick Multilevel Polyimide Films for 3-D Stacked Memory" IEEE Transactions on Advanced Packaging, vol. 22, No. 2, May 1999, pp. 189-199.

(Continued)

*Primary Examiner* — Peniel M Gumedzoe
(74) *Attorney, Agent, or Firm* — David A. Cain; Hoffman Warnick LLC (57) ABSTRACT

The invention provides a semiconductor chip structure having at least one aluminum pad structure and a polyimide buffering layer under the aluminum pad structure, wherein the polyimide buffering layer is self-aligned to the aluminum pad structure, and a method of forming the same. The method includes forming a polyimide buffering layer on a substrate, forming an aluminum pad structure on the buffering layer, and, using the aluminum pad structure as a mask, etching the substrate to remove the polyimide buffering layer from the substrate everywhere except under the aluminum pad structure.

20 Claims, 5 Drawing Sheets

(56) References Cited

OTHER PUBLICATIONS

IBM, "Aluminum Pad Elimination (TDE) Structure", ip.com Prior Art Database, Apr. 9, 2009, 5 pages.

Tzeng et al., "Stress Studies to Optimize the FCBGA Bumping Structure", IEEE, 2006, 5 pages.

IBM, "Self-aligned C4 Support Structure", Apr. 15, 2009, ip.com Prior Art Database, Apr. 15, 2009, 5 pages.

Fan et al., Design and optimization of thermo-mechanical reliability in wafer level packaging, Microelectronics Reliability 50 (2010), pp. 536-537.

"Self-Aligned SiO2 Barrier/CMP Polish Stop for BEOL Wiring in Polyimide Dielectric", IP.com Prior Art Database, IPCOM000132330D, Dec. 7, 2005, 4 pages.

\* cited by examiner

SELF-ALIGNED POLYMER PASSIVATION/ALUMINUM PAD

FIELD OF THE INVENTION

The subject matter disclosed herein relates to methods and structures for forming self-aligned pad structures on semiconductor chip structures. More specifically, aspects of the invention relate to self-aligned polymer passivation/aluminum pad structures on semiconductor chip structures.

BACKGROUND

In flip chip processing of integrated circuit (IC) chips, C4 solder bumps are typically used to connect IC dies to packaging. However, due to the coefficient of thermal expansion (CTE) mismatch between different layers in the packaging, C4 solder bumps can experience large stresses which can lead to crack formation during chip joining. These CTE mismatches must be managed, especially in lead free (Pb-free) solder bumps, to control cracking during chip joining (referred to as "white bump formation").

One solution for reducing stress translated in the back end of line (BEOL) process involves the use of an organic, buffering layer beneath the interconnect bump, on the chip side between the bump and the BEOL dielectric/copper wiring levels. However, this buffering layer (e.g., a photosensitive polyimide (PSPI) layer) is most effective when its thickness is in the range of 8-12 microns, or even higher. Unfortunately, at those thicknesses, other unintended consequences can occur, such as film formation issues, wafer warpage, and a limited ability to form the requisite small offset final via structure. Therefore, although a thick PSPI layer can be an effective white bump risk reduction measure, the thick (and typically multi-coat) PSPI layer also drives excessive and unacceptable wafer warpage. Also, with aluminum final metal, a blanket PSPI layer underneath can be risky, for example, because the PSPI layer can have entrapped corrosives which may outgas later and attack the Aluminum layer.

While attempts have been made to include a polyimide layer beneath an aluminum pad structure in the form of a redistribution layer (RDL), these attempts have several limitations and associated concerns. This type of RDL structure, typically including patterning an aluminum pad on a blanket film of PSPI and then depositing a second PSPI layer, results in a thick PSPI layer (i.e., the thickness of the two PSPI layers). In addition to the unmanageable level of wafer warpage that results from doing this, the thick PSPI layer in the field area of the chip gives rise to potential reliability issues because standard aluminum plasma gases or strip processes can degrade the polyimide surface, causing corrosive materials to become embedded in the polyimide. These materials can react with the aluminum metallic pad/line sidewall, causing metal corrosion of critical features. Also, the resist used to form the aluminum pattern may become difficult or impossible to remove cleanly, leaving debris on top of the metal pad lines.

BRIEF SUMMARY

Embodiments of the invention provide a semiconductor chip structure having at least one aluminum pad structure and a polyimide buffering layer under the aluminum pad structure, wherein the underlying polyimide buffering layer is localized and self-aligned to the aluminum pad structure, and a method of forming the same. The method includes forming a polyimide buffering layer on a substrate, forming an aluminum pad structure on the buffering layer, and, using the aluminum pad structure as a mask, etching the substrate to remove the polyimide buffering layer from the substrate everywhere except under the aluminum pad structure. In other words, the blanket polyimide buffering layer (e.g. a PSPI layer) is removed from the field areas between the wiring structures of the chip. The resulting structure includes a polymer passivation layer self-aligned to an aluminum pad structure, and can aid in reducing stresses involved in lead-free bump chip-package integration.

A first embodiment of the invention includes a method of forming a pad structure on a semiconductor chip structure, the method comprising: forming a polyimide buffering layer on a substrate; forming an aluminum pad structure on the buffering layer; and using the aluminum pad structure as a mask, etching the substrate to remove the polyimide buffering layer from the substrate except under the aluminum pad structure such that the polyimide buffering layer is self-aligned to the aluminum pad structure.

A second embodiment of the invention includes a semiconductor substrate comprising: at least one aluminum pad structure; and a polyimide buffering layer under the aluminum pad structure, wherein the polyimide buffering layer is self-aligned to the aluminum pad structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 2:
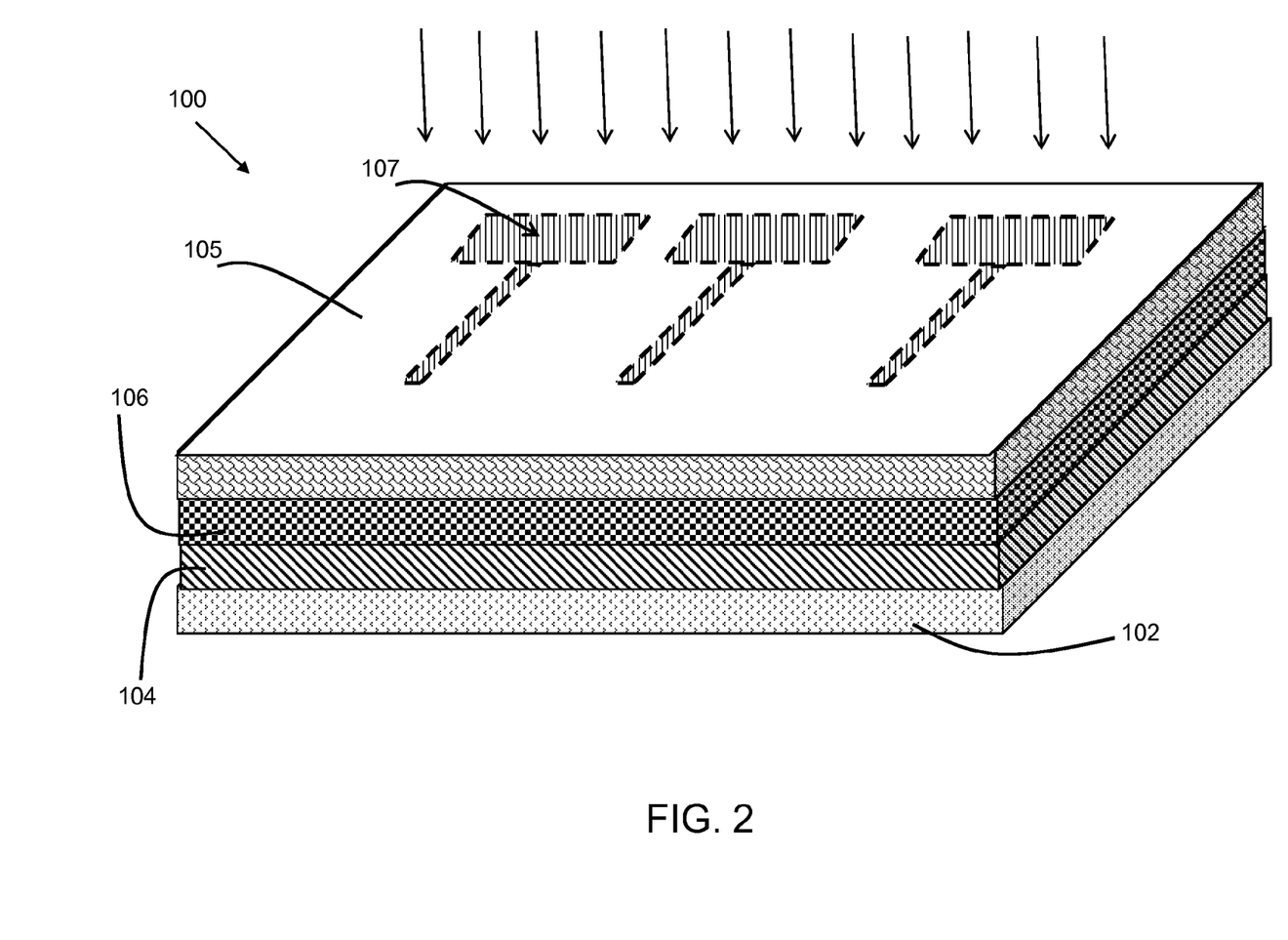
Figure 3:
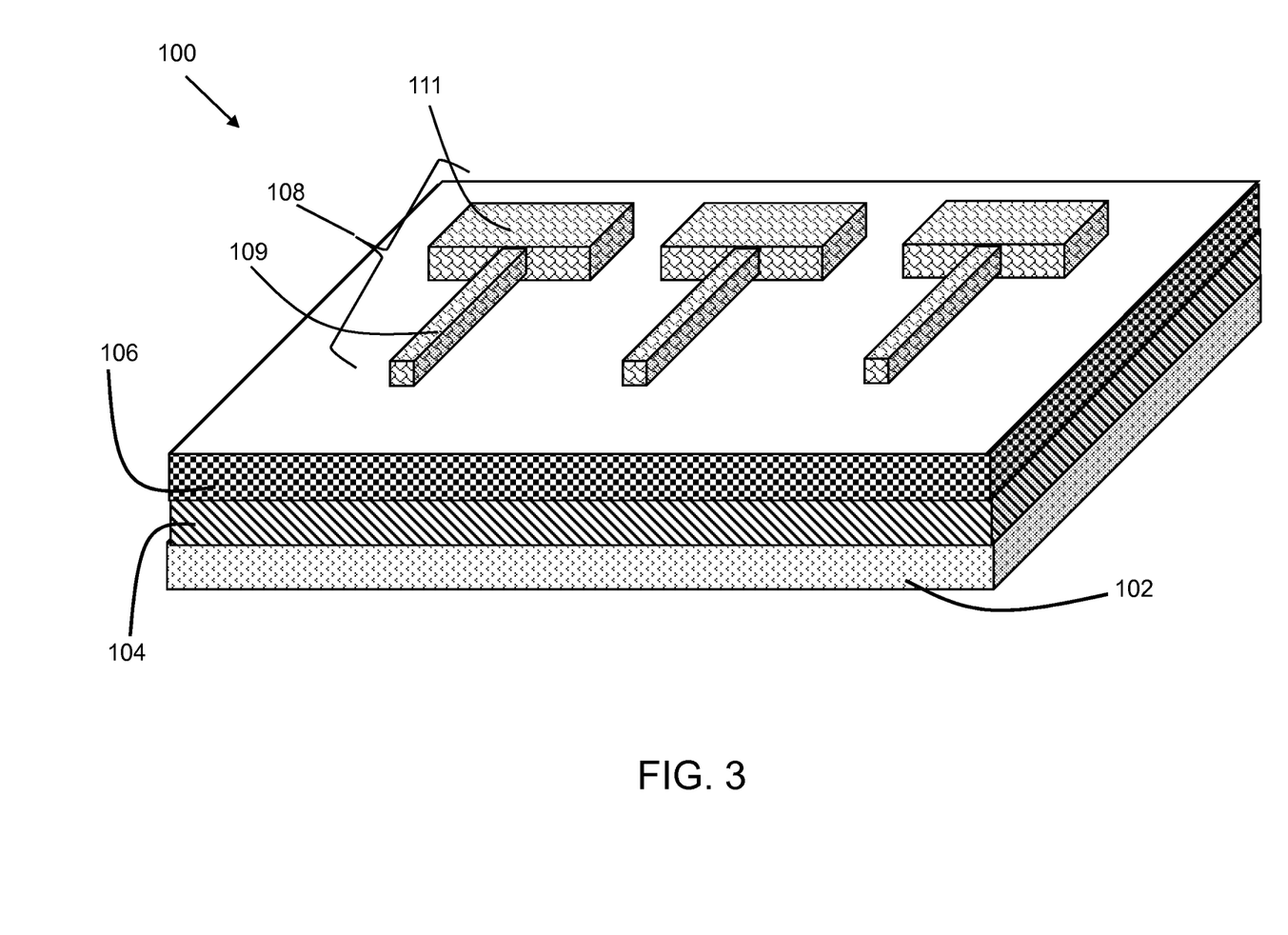
Figure 4:
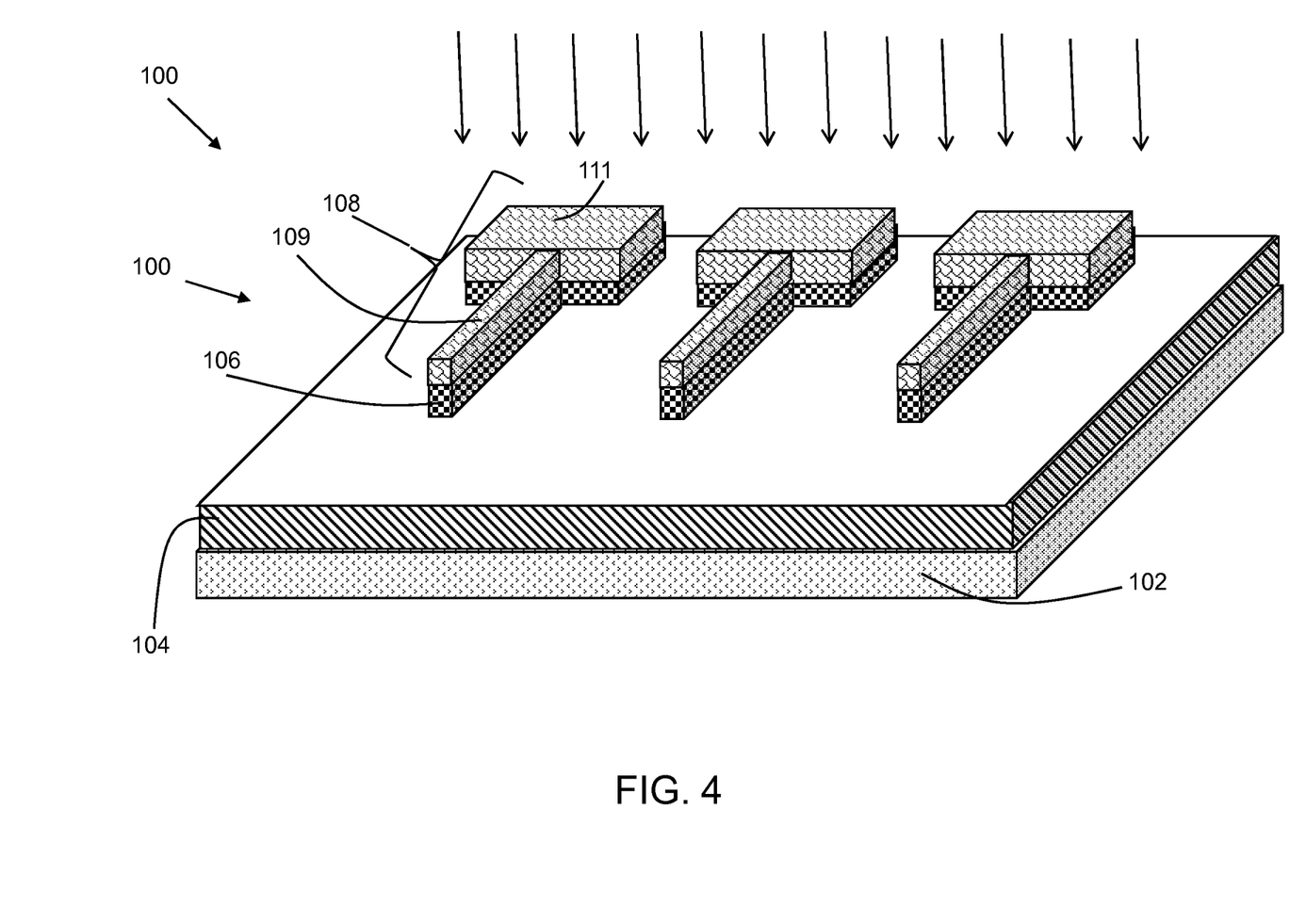
Figure 5:
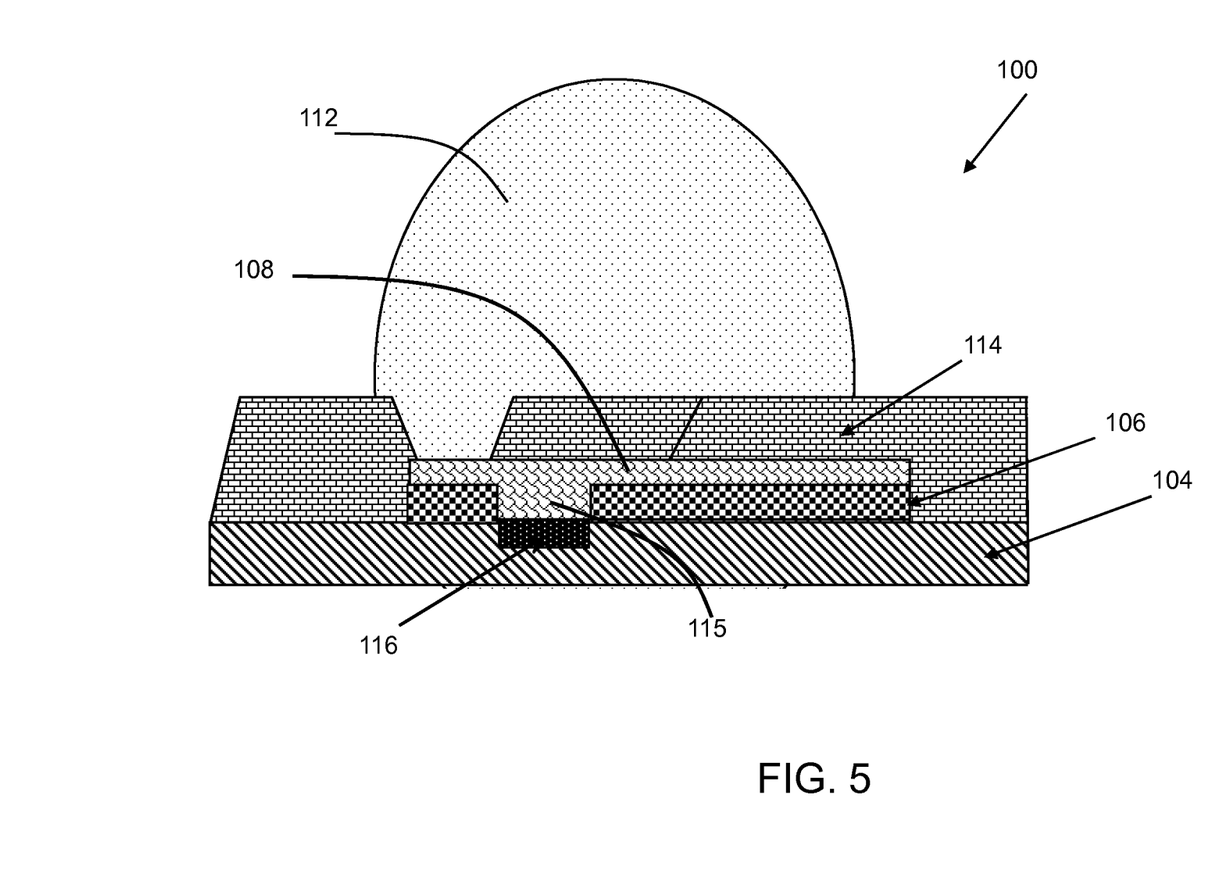
FIG. 5 shows a cross-sectional view of a semiconductor structure according to an embodiment of the present invention.

Turning to the figures, FIGS. 1-4 show the processes involved in forming a polymer passivation layer self-aligned to an aluminum pad structure on a semiconductor chip structure 100, and FIGS. 4 and 5 show different views of different embodiments of semiconductor chip structure 100.

Figure 1:
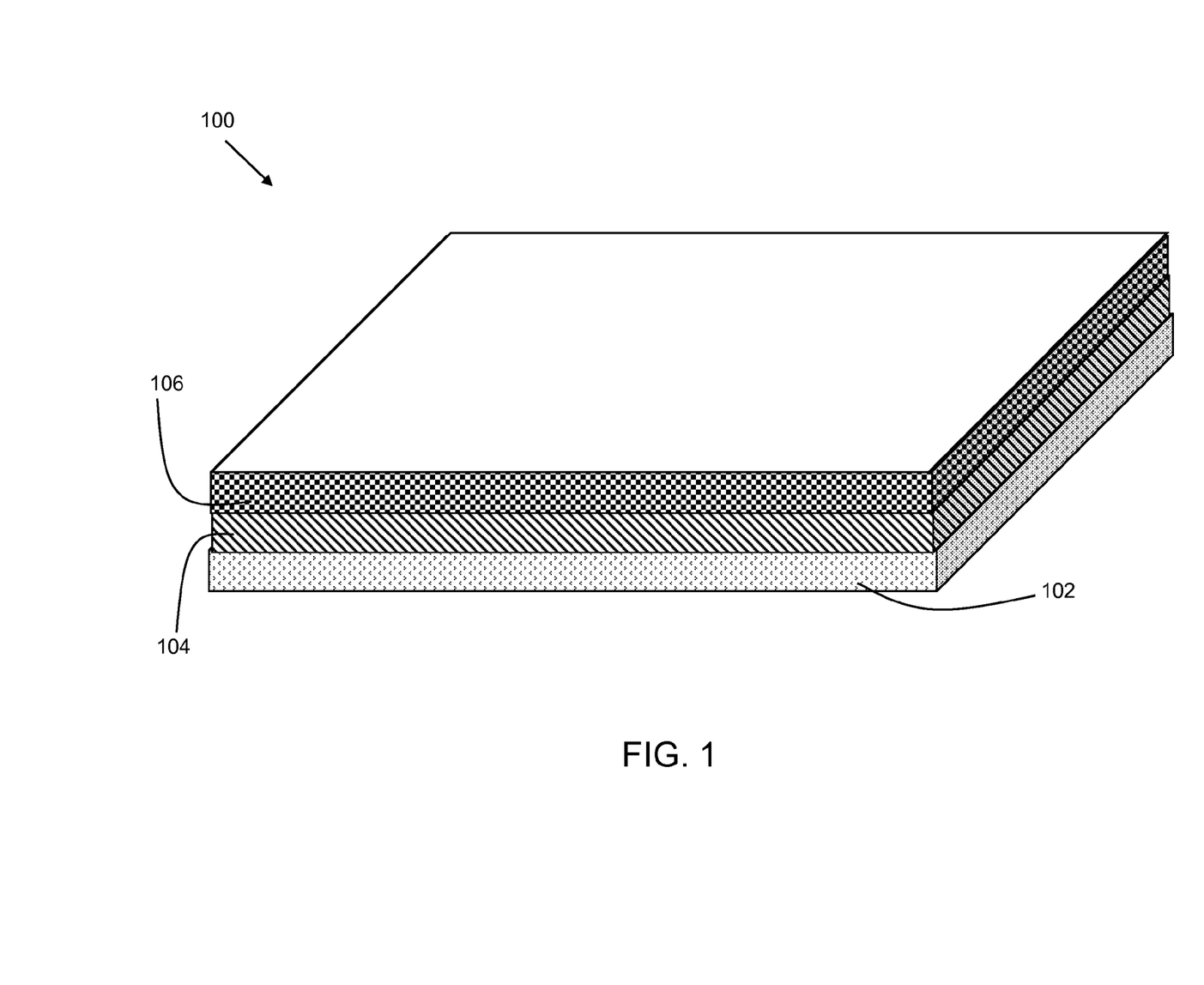
FIGS. 1-4 shows isometric views of a semiconductor chip structure in various stages of a method according to an embodiment of the present invention.

As shown in FIG. 1, a substrate 102 is provided. Substrate 102 may include one or more materials such as silicon, germanium, silicon germanium, silicon carbide, graphene and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate may be strained. For example, substrate 102 may be strained. In one embodiment, substrate 102 is silicon based. In another embodiment, substrate 102 includes a semiconductor on insulator substrate, e.g. silicon bonded to an insulator such as sapphire, quartz or oxide; or a silicon/silicon dioxide/silicon sandwich.

In one embodiment, an oxide layer 104 is included over substrate 102, but it is understood that oxide layer 104 is optional. As known by one of skill in the art, a typical substrate 102 will include a plurality of back end of line (BEOL) copper (Cu) wiring levels. These Cu wiring levels are not shown in the figures since they are well known in the art. It is understood that aspects of the invention disclosed herein are especially appropriate for preventing white bump cracking that tends to occur with the use of advanced low-k dielectric materials that comprise the BEOL levels.

As shown in FIG. 1, a buffering layer 106 is then formed over substrate 102, and optional oxide layer 104. Buffering layer 106 can comprise any now known or later developed buffering material, such as a polyimide or benzocyclobutene (BCB). Polyimide can be photosensitive polyimide (PSPI) or non-photosensitive polyimide. Similarly, BCB can be photosensitive BCB or non-photosensitive BCB. Those skilled in the art will recognize that other polymers can be used, especially those that are insulators, have a low dielectric constant (e.g., less than about 4), and are thermally stable (up to 200-400 degrees Celsius or greater).

Polyimide buffering layer 106 can be formed by any known forming procedure, for example, polyimide buffering layer 106 can be deposited on substrate 102 or oxide 104. Polyimide buffering layer 106 can have a thickness of approximately 1 micron to approximately 14 microns, or greater. At this point, polyimide buffering layer 106 can be cured if desired.

Next, as shown in FIGS. 2 and 3, at least one aluminum pad structure 108 is formed on polyimide buffering layer 106. Aluminum pad structure 108 can be formed by any known forming procedure, for example, by depositing a layer of aluminum 105 over polyimide buffering layer 106, and using a mask 107 to etch (illustrated by arrows in FIG. 2) aluminum layer 105 to form aluminum pad structure 108. FIG. 3 shows three aluminum pad structures 108, but it is understood that any desired number of pad structures 108 can be formed. As is understood by one in the art, each aluminum pad structure 108 is configured for a C4 solder bump to be positioned thereon, and each aluminum pad structure 108 includes at least one wire 109 and at least one wire pad 111. As is understood by one in the art, a strip resist can be performed at this stage to remove any unwanted photoresist layers.

Next, as shown in FIG. 4, aluminum pad structure 108 is used as a mask, and polyimide buffering layer 106 is etched (shown by arrows in FIG. 4) to anistropically remove polyimide buffering layer 106 except under aluminum pad structure 108. Therefore, the blanket buffer layer 106 is removed from the field areas surrounding pad structure 108. As illustrated in FIG. 4, using the aluminum pad structure 108 as a mask, and patterning the buffering layer 106 image, results in a polyimide buffering layer 106 that is self-aligned to the aluminum pad structure 108. In other words, polyimide buffering layer 106 has the same general shape as pad structure 108, for example, the same shape as wire 109 and wire pad 111 shown in FIG. 4. Therefore, semiconductor chip 100 includes a layer of buffering material 106, for example, a layer of thick PSPI, under aluminum pad structure 108.

It is understood that any etching discussed herein can be accomplished using any known or later developed etching processes, for example, a reactive ion etching (RIE) process that uses chemically reactive O2 plasma to remove material. It is also understood that while the strip resist after formation of aluminum pad structure 108 and the etching to form a self-aligned buffering layer 106 under pad structure 108 are discussed as two steps, they can be combined in a simultaneous process step. In other words, a combination aluminum strip resist and a layer 106 patterning process can be performed.

At this point, a conventional wet clean process can be performed on chip structure 100. The wet clean process could comprise any now known or later developed clean process, for example, a wet clean comprised of, for example, a mixture of dilute chromic and phosphoric acid, using a standard O2 plasma ash and de-ionized water rinse. After cleaning, as shown in cross-section in FIG. 5, a C4 solder bump 112 can be formed as known in the art to contact a pad structure 108. Solder bump 112 may be any solderable material that can include, but is not limited to, material having tin and lead, tin without lead, tin with a residual of copper or silver, tin bismuth, tin indium, etc.

Optionally, after polyimide buffering layer 106 has been etched to remove the buffering material except under pad structure(s) 108, and before a C4 solder bump 112 has been bonded to pad structure 108, an additional, second, polyimide layer 114 can be deposited over the substrate, including over aluminum pad structure(s) 108. Second polyimide layer 114 is shown in FIG. 5. Second polyimide layer 114 can comprise a similar material as first polyimide layer 106, or can comprise another known buffering material. Second polyimide layer 114 can have a thickness similar to first layer 106, or in combination, a total thickness of both layers 106, 114 together can comprise approximately 4 to approximately 14 microns. Edges of first polyimide layer 106 can be sealed with the deposition of second polyimide layer 114. This can result in lower contamination of polyimide layer 106.

After second layer 114 is formed, a portion of second polyimide layer 114 can be removed to expose at least a portion of aluminum pad structure 108 so that a C4 solder bump 112 can be formed to contact aluminum pad structure 108, as shown in FIG. 5. As also shown in FIG. 5, as understood by one of skill in the art, C4 solder bump 112 and pad structure 108 can be connected as desired to back end of line (BEOL) dielectric/copper wiring levels below aluminum pad structure 108, e.g., through a via 115 to a copper level 116.

A semiconductor chip structure 100 according to embodiments of the invention is shown in FIG. 5. As shown, semiconductor chip structure 100 includes at least one aluminum pad structure 108, and a polyimide buffering layer 106 under aluminum pad structure 108, where polyimide buffering layer 106 has been removed from the field areas surrounding pad structure 108 such that the remaining polyimide buffering layer 106 is self-aligned to pad structure 108. In one embodiment, a second polyimide buffer layer 114 is included over pad structure 108 and the surrounding field areas. In contrast to this invention, conventional chip structures having a C4 solder bump pad structure can have a PSPI layer everywhere but under the bump/pad structure, with no buffering layer, i.e., a polyimide layer 106, under the pad structure.

Conventional chip structures also may have a double PSPI layer in the field area surrounding the pad structure, which can lead to wafer warpage issues associated with the high tensile forces resulting from the double thickness. In the embodiments of this invention, a first polyimide layer 106 is put down underneath pad structure 108 (e.g., an Al pad and wiring) and then removed from the surrounding field areas so polyimide layer 106 stays only locally under aluminum pad structure 108. Then another polyimide layer 114 is put down on top of the Al pad and wiring structure 108. This method and structure provides stress buffering and minimizes CPI cracking that forms "white bumps" during chip join to the laminate. Localizing first polyimide layer 106 under pad structure 108, as opposed to a full blanket film, minimizes wafer warpage issues.

Chip structure 100 allows for a relatively thick, e.g., approximately 1-14 microns, or greater, passivation layer, e.g., a PSPI layer 106, beneath solder bump structure 108 on the tensile side of chip 100, but will not trigger excessive wafer warpage during processing. The "tensile" side of the chip refers to the (180 degree) side of the solder bump that faces towards the nearest chip edge and corner, where CTE mismatch stress during chip join cooling are accentuated to a point of maximum tensile chip-cracking stress. Including first PSPI layer 106 only under pad structure 108 provides localized stress buffering that minimizes the possibility of white bump stress cracking during chip join.

The process according to embodiments of the invention allows for a two coat PSPI, while minimizing warpage issues by localizing first PSPI layer 106 under aluminum pad structure 108. In other words, the total thickness of PSPI in the field area of a chip is consistent with the thickness of a single PSPI layer, since the first PSPI layer 106 is deposited then removed from the field area using the methods disclosed in this invention.

Embodiments of the methods and structures of this invention have the further advantage of reducing cost and complexity, for example, first buffering layer, i.e., PSPI layer 106, can replace an existing oxide film, and the patterning of PSPI layer 106 does not require a separate mask because layer 106 self-aligns with aluminum pad structure 108. In addition, combining the resist strip with the patterning of PSPI layer 106 can eliminate a stand-alone strip process typically required for aluminum pad structure 108. In addition, the methods discussed herein remove bulk film PSPI between features so that embedded contaminants will not cause aluminum edge corrosion.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming a pad structure on a semiconductor chip structure, the method comprising:
    forming a polyimide buffering layer directly over one of:
        a substrate, or
        an oxide layer formed over the substrate;
    forming an aluminum pad structure on the buffering layer; and
    using the aluminum pad structure as a mask, etching the substrate to remove the polyimide buffering layer from the substrate except under the aluminum pad structure such that the polyimide buffering layer is self-aligned to the aluminum pad structure.

2. The method of claim 1, wherein the polyimide buffering layer comprises at least one of the following polymers: photosensitive polyimide (PSPI), benzocyclobutene (BCB), and polybenzoxazole (PBO).

3. The method of claim 1, wherein the aluminum pad structure includes at least one wire and at least one wire pad.

4. The method of claim 3, wherein the polyimide buffering layer is self-aligned to the at least one wire and the at least one wire pad.

5. The method of claim 1, wherein the forming of the polyimide buffering layer includes depositing the polyimide buffering layer on the substrate.

6. The method of claim 1, wherein the aluminum pad structure is configured to bond with a C4 solder bump positioned thereon.

7. The method of claim 1, wherein the substrate comprises an oxide.

8. The method of claim 1, wherein the forming of the aluminum pad structure includes depositing a layer of aluminum over the polyimide buffering layer, and using a mask to etch the layer of aluminum to form the aluminum pad structure.

9. The method of claim 1, wherein the polyimide buffering layer under the aluminum pad structure has a thickness of approximately 1 micron to approximately 14 microns.

10. The method of claim 1, further comprising:
    depositing a second polyimide layer after the etching of the substrate to remove the polyimide buffering layer, wherein the second polyimide layer is deposited over the substrate and the aluminum pad structure.

11. The method of claim 10, further comprising:
    removing a portion of the second polyimide layer to expose at least a portion of the aluminum pad structure; and
    forming a C4 solder bump contacting the aluminum pad structure.

12. The method of claim 1, further comprising: performing a wet clean process on the semiconductor chip structure after the etching of the substrate to remove the polyimide buffering layer.

13. The method of claim 1, further comprising: curing the polyimide buffering layer after the depositing of the polyimide buffering layer on the substrate.

14. A semiconductor substrate comprising:
    at least one aluminum pad structure; and
    a polyimide buffering layer under the aluminum pad structure, wherein the polyimide buffering layer is self-aligned to the aluminum pad structure, and
    wherein the polyimide buffering layer is formed directly over one of:
        a substrate, or
        an oxide layer formed over the substrate.

15. The semiconductor substrate of claim 14, wherein the polyimide buffering layer comprises at least one of the following polymers: photosensitive polyimide (PSPI), benzocyclobutene (BCB), and polybenzoxazole (PBO).

16. The semiconductor substrate of claim 14, wherein the pad structure includes at least one wire and at least one wire pad.

17. The semiconductor substrate of claim 16, wherein the polyimide buffering layer is self-aligned to the at least one wire and the at least one wire pad.

18. The semiconductor substrate of claim 14, wherein the substrate comprises an oxide.

19. The semiconductor substrate of claim 14, wherein the polyimide buffering layer under the aluminum pad structure has a thickness of approximately 1 micron to approximately 14 microns.

20. The semiconductor substrate of claim 14, further comprising:
   a second polyimide layer over the substrate and the aluminum pad structure.

\* \* \* \* \*